(12) United States Patent
Sun

(10) Patent No.: US 12,696,575 B2
(45) Date of Patent: Jul. 28, 2026

(54) SOLAR CELL AND PREPARATION METHOD THEREFOR

(71) Applicant: TONGWEI SOLAR (JINTANG) CO., LTD., Chengdu (CN)

(72) Inventor: Lin Sun, Chengdu (CN)

(73) Assignee: TONGWEI SOLAR (JINTANG) CO., LTD., Chengdu (CN)

( * ) Notice: Subject to any disclaimer, the term of this patent is extended or adjusted under 35 U.S.C. 154(b) by 0 days.

(21) Appl. No.: 18/870,631

(22) PCT Filed: Sep. 28, 2023

(86) PCT No.: PCT/CN2023/122375

§ 371 (c)(1),
(2) Date: Nov. 29, 2024

(87) PCT Pub. No.: WO2024/098999

PCT Pub. Date: May 16, 2024

(65) Prior Publication Data

US 2025/0331331 A1 Oct. 23, 2025

(30) Foreign Application Priority Data

Nov. 11, 2022 (CN) .......................... 202211414121.1

(51) Int. Cl.
*H10F 77/30* (2025.01)
*H10F 10/164* (2025.01)
(Continued)

(52) U.S. Cl.
CPC ......... *H10F 77/311* (2025.01); *H10F 10/164* (2025.01); *H10F 71/103* (2025.01);
(Continued)

(58) Field of Classification Search
None
See application file for complete search history.

(56) References Cited

U.S. PATENT DOCUMENTS

| | | | |
|---|---|---|---|
| 2011/0020976 A1* | 1/2011 | Watai | .................... H10F 77/122 |
| | | | 438/57 |
| 2011/0232749 A1* | 9/2011 | Lienhart | ................. H10F 19/30 |
| | | | 204/192.12 |

(Continued)

FOREIGN PATENT DOCUMENTS

| | | |
|---|---|---|
| CN | 101399293 A | 4/2009 |
| CN | 104409572 A | 3/2015 |

(Continued)

OTHER PUBLICATIONS

English language machine translation of CN-115312624-A. (Year: 2025).*

(Continued)

*Primary Examiner* — Eli S Mekhlin

(57) ABSTRACT

A solar cell, comprising a silicon cell main body (110), a first transparent conductive oxide layer (120), a second transparent conductive oxide layer (130), an insulating passivation layer (160), and a second electrode (150), wherein the insulating passivation layer (160) covers edges of the back face of the silicon cell main body (110), and at the edges of the back face of the silicon cell main body (110), the second transparent conductive oxide layer (130) and the first transparent conductive oxide layer (120) are arranged spaced apart from each other by means of the insulating passivation layer (160) arranged therebetween.

15 Claims, 3 Drawing Sheets

(51) Int. Cl.

| | | |
|---|---|---|
| *H10F 71/10* | (2025.01) | |
| *H10F 77/166* | (2025.01) | |
| *H10F 77/20* | (2025.01) | |

(52) U.S. Cl.
  CPC ....... *H10F 77/1662* (2025.01); *H10F 77/247* (2025.01); *H10F 77/219* (2025.01)

(56) References Cited

U.S. PATENT DOCUMENTS

| | | | |
|---|---|---|---|
| 2016/0308079 A1* | 10/2016 | Adachi ................. | H10F 77/311 |
| 2016/0365366 A1* | 12/2016 | Zhao ................. | H01L 21/02565 |
| 2017/0207351 A1 | 7/2017 | Lee et al. | |

FOREIGN PATENT DOCUMENTS

| | | |
|---|---|---|
| CN | 104584237 A | 4/2015 |
| CN | 105684165 A | 6/2016 |
| CN | 105990462 A | 10/2016 |
| CN | 109473493 A | 3/2019 |
| CN | 111416003 A | 7/2020 |
| CN | 114078986 A | 2/2022 |
| CN | 114171623 A | 3/2022 |
| CN | 115312624 A * | 11/2022 | ........... H10F 71/129 |
| EP | 1906455 A1 * | 4/2008 | ........... H10F 77/311 |
| TW | I753084 B | 1/2022 |
| WO | 2020082151 A1 | 4/2020 |
| WO | 2022095511 A1 | 5/2022 |
| WO | 2022170860 A1 | 8/2022 |

OTHER PUBLICATIONS

International Search Report of PCT Patent Application No. PCT/CN2023/122375 issued on Dec. 4, 2023.

Written Opinion of PCT Patent Application No. PCT/CN2023/122375 issued on Dec. 4, 2023.

European Search Report of European Patent Application No. 23887692.4 issued on Aug. 21, 2025.

Christoph Messmer et al., Influence of Interfacial Oxides at TCO/Doped Si Thin Film Contacts on the Charge Carrier Transport of Passivating Contacts, IEEE Journal of Photovoltaics, Mar. 2020, pp. 343~350, vol. 10, No. 2.

K.-W.A. Chee et al., Recent advancements in carrier-selective contacts for high-efficiency crystalline silicon solar cells: Industrially evolving approach, Nano Energy, Elsevier, Dec. 30, 2021, vol. 95.

* cited by examiner

S110. Preparing a silicon cell main body 110

S120. Depositing a first transparent conductive oxide layer 120 on the first doped amorphous silicon layer S130. Disposing a mask plate on the edge of the second doped amorphous silicon layer, and depositing a second transparent conductive oxide layer 130 on the second doped amorphous silicon layer S140. Forming a first electrode 140 (a front electrode) on the first transparent conductive oxide layer 120, and forming a second electrode 150 (a back electrode) on the second transparent conductive oxide layer 130

S150. Removing the mask plate, and depositing an insulating passivation layer 160 on the second transparent conductive oxide layer 130. The second electrode 150 (the back electrode) extends through the insulating passivation layer 160 and is electrically connected to the second transparent conductive oxide layer 130

FIG. 4

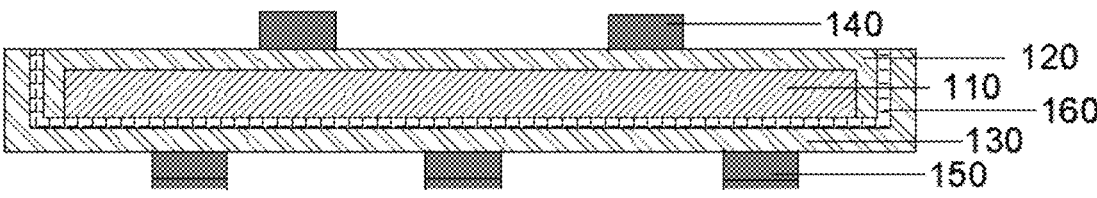

FIG. 5

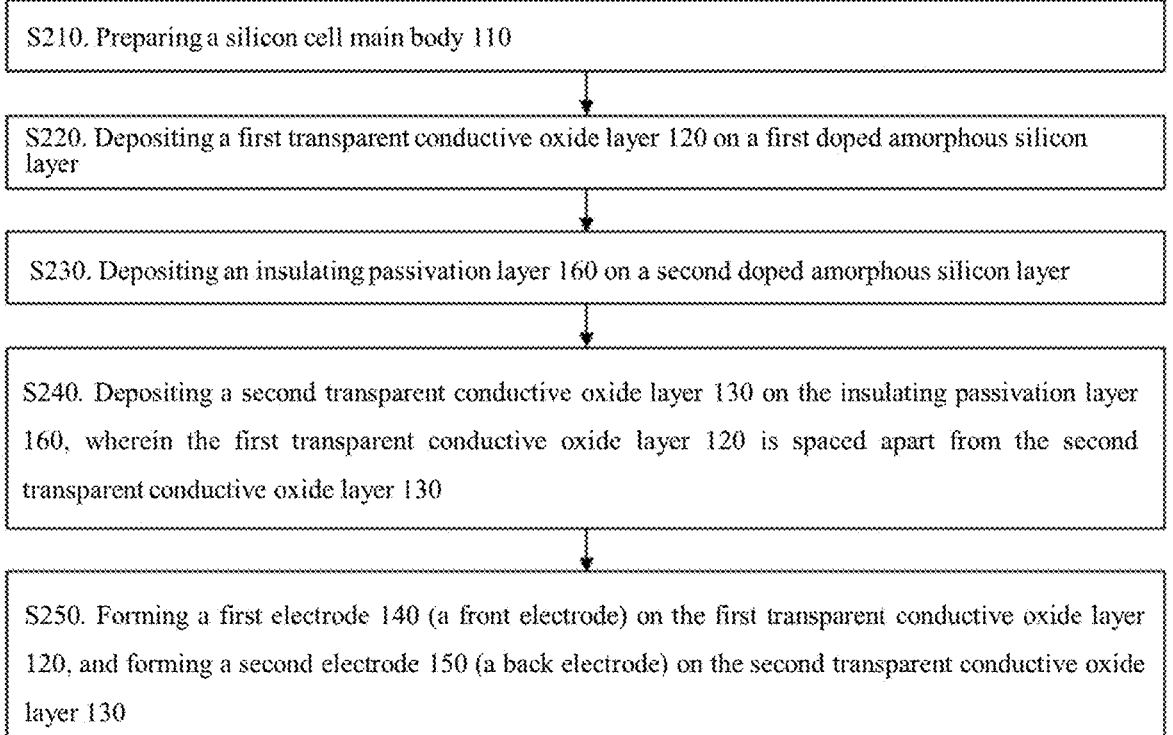

S210. Preparing a silicon cell main body 110

S220. Depositing a first transparent conductive oxide layer 120 on a first doped amorphous silicon layer S230. Depositing an insulating passivation layer 160 on a second doped amorphous silicon layer S240. Depositing a second transparent conductive oxide layer 130 on the insulating passivation layer 160, wherein the first transparent conductive oxide layer 120 is spaced apart from the second transparent conductive oxide layer 130

S250. Forming a first electrode 140 (a front electrode) on the first transparent conductive oxide layer 120, and forming a second electrode 150 (a back electrode) on the second transparent conductive oxide layer 130

FIG. 6

SOLAR CELL AND PREPARATION METHOD THEREFOR

This application is an U.S. national phase application under 35 U.S.C. § 371 based upon international patent application No. PCT/CN2023/122375 filed on Sep. 28, 2023, which itself claims priority to Chinese Patent Application No. CN202211414121.1, filed on Nov. 11, 2022, entitled "SOLAR CELL AND PREPARATION METHOD THEREFOR", the content of which is hereby incorporated by reference in its entirety.

TECHNICAL FIELD

The present application relates to the technical field of solar cells, and in particular to a solar cell and a method for preparing the same.

BACKGROUND

Heterojunction (HJT) solar cell has the structure as follows: a front intrinsic amorphous silicon layer, an n-type doped amorphous silicon layer, a front transparent conductive oxide layer (i.e., a TCO film) and a front electrode sequentially arranged on a front surface of a silicon substrate; and a back intrinsic amorphous silicon layer, a p-type doped amorphous silicon layer, a back transparent conductive oxide layer (i.e., a TCO film) and a back electrode sequentially arranged on a back surface of the silicon substrate. The photo-generated current of the HJT solar cell is respectively drawn from both surfaces of the solar cell by the TCO films and the metal electrodes.

In order to avoid electric leakage and conduction between the front surface and the back surface, a mask plate is usually disposed at the edge of the P-type doped amorphous silicon layer prior to depositing the back transparent conductive oxide layer on the back surface, and then the back transparent conductive oxide layer is coated, thereby can preventing the front transparent conductive oxide layer and the back transparent conductive oxide layer from being conducted.

However, the inventors have found that in this method, a blank region of 0.7 mm to 1 mm on the edge of the back surface of the cell is not coated with the back transparent conductive oxide layer, which will result in incomplete coverage of the blue film on the back surface of the cell. The reliability of the cell in terms of sodium resistance and damp heat test (DH) is relatively poor. Some sodium ions and water vapor can easily invade the cell from the position not covered by the blue film on the back surface of the cell, resulting in low efficiency of the cell. Meanwhile, the passivation effect is relatively poor, resulting in a loss in cell efficiency.

SUMMARY

According to some embodiments of the present application, the present application provides a solar cell. The solar cell includes a silicon cell main body, a first transparent conductive oxide layer, a second transparent conductive oxide layer, an insulating passivation layer and a second electrode. The first transparent conductive oxide layer is located on a front surface of the silicon cell main body. The second transparent conductive oxide layer and the second electrode are located on a back surface of the silicon cell main body. The insulating passivation layer covers an edge of the back surface of the silicon cell main body. At the edge of the back surface of the silicon cell main body, the second transparent conductive oxide layer and the first transparent conductive oxide layer are spaced apart from each other by the insulating passivation layer.

In some embodiments of the present application, the insulating passivation layer further covers the second transparent conductive oxide layer, and the second electrode extends through the insulating passivation layer and is electrically connected to the second transparent conductive oxide layer.

In some embodiments of the present application, a height of the second electrode is 12 μm to 15 μm.

In some embodiments of the present application, a thickness of the insulating passivation layer is 70 nm to 90 nm.

In some embodiments of the present application, the insulating passivation layer covers the back surface of the silicon cell main body, and the second transparent conductive oxide layer covers the insulating passivation layer.

In some embodiments of the present application, the insulating passivation layer is one selected from $Si_3N_4$, $MgF_2$, and $SiO_x$.

In some embodiments of the present application, the insulating passivation layer 160 is a $Si_3N_4$ layer, and a refractive index of the $Si_3N_4$ layer is 2.05 to 2.20.

In some embodiments of the present application, a width of the second electrode is 50 μm to 60 μm.

In some embodiments of the present application, the insulating passivation layer further covers the first transparent conductive oxide layer on a side surface of the silicon cell main body.

In some embodiments of the present application, the silicon cell main body includes a silicon wafer, a first intrinsic amorphous silicon layer, a first doped amorphous silicon layer, a second intrinsic amorphous silicon layer, and a second doped amorphous silicon layer. The first intrinsic amorphous silicon layer and the first doped amorphous silicon layer are sequentially disposed on a front surface of the silicon wafer, and the second intrinsic amorphous silicon layer and the second doped amorphous silicon layer are sequentially disposed on a back surface of the silicon wafer. At an edge of the second doped amorphous silicon layer, the second transparent conductive oxide layer and the first transparent conductive oxide layer are spaced apart from each other, and the insulating passivation layer covers the edge of the second doped amorphous silicon layer.

In some embodiments of the present application, the solar cell further includes a first electrode disposed on the front surface of the silicon cell main body.

Further, the present application provides a method for preparing a solar cell. The method includes the following steps:

forming a first transparent conductive oxide layer on a front surface of a silicon cell main body;

forming a second transparent conductive oxide layer and a second electrode on a back surface of the silicon cell main body;

forming an insulating passivation layer on an edge of the back surface of the silicon cell main body, wherein the first transparent conductive oxide layer and the second transparent conductive oxide layer are spaced apart from each other by the insulating passivation layer.

In some embodiments of the present application, the step of forming the insulating passivation layer is performed after the step of forming the second transparent conductive oxide layer.

In some embodiments of the present application, prior to the step of forming the second transparent conductive oxide layer, the method further includes a step of disposing a mask plate on the edge of the back surface of the silicon cell main body; and after the step of forming the second electrode and prior to the step of forming the insulating passivation layer, the method further includes a step of removing the mask plate.

In some embodiments of the present application, the step of forming the insulating passivation layer is performed after the step of forming the first transparent conductive oxide layer and prior to the step of forming the second transparent conductive oxide layer.

In some embodiments of the present application, a height of the second electrode is 12 µm to 15 µm.

In some embodiments of the present application, a width of the second electrode is 50 µm to 60 µm.

In some embodiments of the present application, a thickness of the insulating passivation layer is 70 nm to 90 nm.

In some embodiments of the present application, the insulating passivation layer is one selected from $Si_3N_4$, $MgF_2$, and $SiO_x$.

In some embodiments of the present application, the insulating passivation layer is $Si_3N_4$, and a method for forming the insulating passivation layer includes: introducing and then depositing $SiH_4$ gas and $NH_3$ gas to form a $Si_3N_4$ layer with a thickness of 70 nm to 90 nm.

In some embodiments of the present application, the insulating passivation layer is $MgF_2$, and a method for forming the insulating passivation layer includes: sputtering deposition of a $MgF_2$ layer with a thickness of 70 nm to 90 nm by means of magnetron sputtering.

In some embodiments of the present application, the insulating passivation layer is $SiO_x$, and a method for forming the insulating passivation layer includes: introducing and then depositing $SiH_4$ gas and $N_2O$ gas to form a $SiO_x$ layer with a thickness of 70 nm to 90 nm.

In some embodiments of the present application, a method for preparing the silicon cell main body includes:

depositing a first intrinsic amorphous silicon layer and a first doped amorphous silicon layer on a front surface of the silicon wafer; and depositing a second intrinsic amorphous silicon layer and a second doped amorphous silicon layer on a back surface of the silicon wafer.

BRIEF DESCRIPTION OF THE DRAWINGS

In order to illustrate the technical solutions of the embodiments of the present application more clearly, the drawings used in the embodiments will be described briefly. Apparently, the following described drawings are merely for the embodiments of the present application and should not be considered as limiting its scope. Other drawings can be derived according to these drawings by those of ordinary skill in the art without any creative effort.

FIG. 4 is a flow chart of a first preparation process of a solar cell provided in an embodiment of the present application.

FIG. 5 is a schematic view of a second layer structure of the solar cell provided in the embodiment of the present application.

FIG. 6 is a flow chart of a second preparation process of a solar cell provided in an embodiment of the present application.

REFERENCE SIGNS 10. n-type silicon wafer; 11. front intrinsic amorphous silicon layer; 12. back intrinsic amorphous silicon layer; 13. n-type doped amorphous silicon layer; 14. p-type doped amorphous silicon layer; 15. front transparent conductive oxide layer; 16. back transparent conductive oxide layer; 17. front electrode; 18. back electrode; 141. mask region;

110. silicon cell main body; 120. first transparent conductive oxide layer; 130. second transparent conductive oxide layer; 140. first electrode; 150. second electrode; 160. insulating passivation layer.

DETAILED DESCRIPTION

Figure 1:
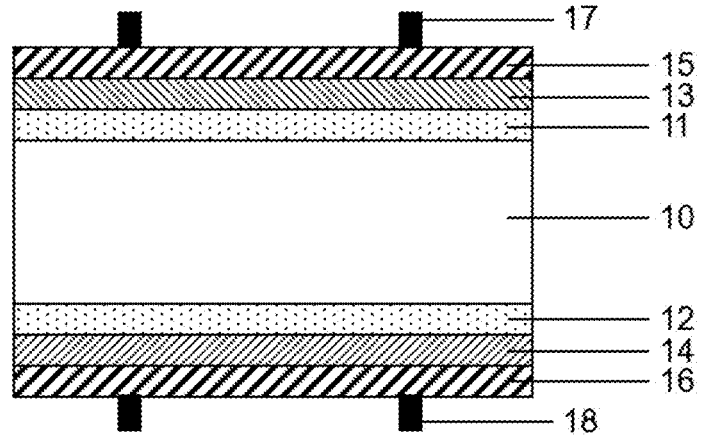
FIG. 1 is a schematic view of a layer structure of a solar cell provided by the prior art.

FIG. 1 is a schematic view of a layer structure of a solar cell provided by the prior art. Referring to FIG. 1, a HJT solar cell in the prior art includes: an n-type silicon wafer 10; a front intrinsic amorphous silicon layer 11, an n-type doped amorphous silicon layer 13, a front transparent conductive oxide layer 15 (i.e., a TCO film) and a front electrode 17 (i.e., a metal electrode) sequentially disposed on a front surface of the n-type silicon wafer 10; and a back intrinsic amorphous silicon layer 12, a p-type doped amorphous silicon layer 14, a back transparent conductive oxide layer 16 (i.e., a TCO film) and a back electrode 18 (i.e., a metal electrode) sequentially disposed on a back surface of the n-type silicon wafer 10. The photo-generated current of the HJT solar cell is respectively drawn from both surfaces of the solar cell by the TCO films and the metal electrodes.

Figure 2:
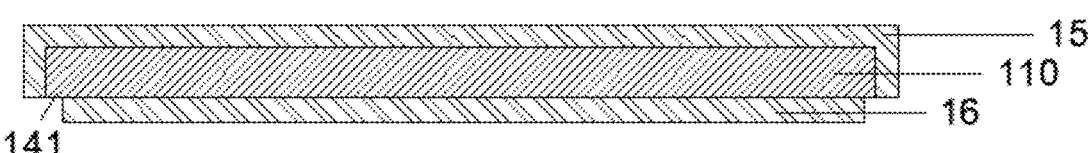
FIG. 2 is a structural schematic view of a solar cell in the prior art after forming a back transparent conductive oxide layer.

In the process of depositing the front transparent conductive oxide layer 15 and the back transparent conductive oxide layer 16, due to the occurrence of wrap-around plating, the wrap-around layer is usually deposited on a side surface of the cell. If the front transparent conductive oxide layer 15 is electrically connected to the back transparent conductive oxide layer 16, there is a problem of electric leakage and conduction between the front surface and the back surface. FIG. 2 is a structural schematic view of a solar cell in the prior art after forming the back transparent conductive oxide layer 16. Referring to FIG. 2, the silicon cell main body 110 includes an n-type doped amorphous silicon layer 13, a front intrinsic amorphous silicon layer 11, an n-type silicon wafer 10, a back intrinsic amorphous silicon layer 12 and a p-type doped amorphous silicon layer 14 sequentially disposed from top to bottom. In order to avoid the electrical conduction between the front surface and the back surface, prior to depositing the back transparent conductive oxide layer 16, a mask plate is usually disposed at the edge of the p-type doped amorphous silicon layer 14 to form a mask region 141 on the surface of the p-type doped amorphous silicon layer 14, followed by plating the back transparent conductive oxide layer 16, so that the front transparent conductive oxide layer 15 and the back transparent conductive oxide layer 16 are prevented from being contacted and electrically conducted.

However, the above method will lead to a blank gap region of 0.7 mm to 1 mm (i.e., D1 region) on the edge of the back surface of the solar cell that is not coated, and this region has a relatively poor passivation effect, resulting in decreased efficiency of the cell.

Therefore, the present application provides a solar cell and a method for preparing the same, which can improve the passivation effect of the solar cell and improve the efficiency of the cell.

The solar cell provided in the present application includes a silicon cell main body, a first transparent conductive oxide layer, a second transparent conductive oxide layer, an insulating passivation layer and a second electrode. The first transparent conductive oxide layer is located on a front surface of the silicon cell main body. The second transparent conductive oxide layer and the second electrode are located on a back surface of the silicon cell main body. The insulating passivation layer covers an edge of the back surface of the silicon cell main body. At the edge of the back surface of the silicon cell main body, the second transparent conductive oxide layer and the first transparent conductive oxide layer are spaced apart from each other by the insulating passivation layer.

In such a solar cell, there is a certain distance between the first transparent conductive oxide layer and the second transparent conductive oxide layer, which causes the edge of the back surface of the silicon cell main body not to be covered by the transparent conductive oxide layer. In the present application, the insulating passivation layer is provided and can cover this region, which prevents the edge of the second intrinsic amorphous silicon layer from being exposed, making the cell to have good reliability in aspects of sodium resistance, damp heat test (DH), etc. and good passivation effect, and thus improving the efficiency of the cell.

Figure 3:
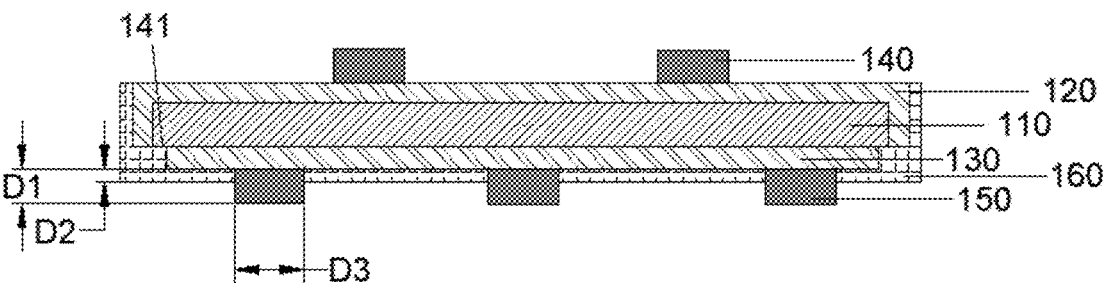
FIG. 3 is a schematic view of a first layer structure of a solar cell provided in an embodiment of the present application.

FIG. 3 is a schematic view of a layer structure of a solar cell provided in an embodiment of the present application. Referring to FIG. 3, the solar cell includes a silicon cell main body 110; a first transparent conductive oxide layer 120 and a first electrode 140 located on the front surface of the silicon cell main body 110; and a second transparent conductive oxide layer 130, an insulating passivation layer 160 and a second electrode 150 located on the back surface of the silicon cell main body 110. At the edge of the back surface of the silicon cell main body 110, the second transparent conductive oxide layer 130 and the first transparent conductive oxide layer 120 are spaced apart from each other, so as to avoid electrical conduction between the first transparent conductive oxide layer 120 and the second transparent conductive oxide layer 130. Meanwhile, the insulating passivation layer 160 covers the edge of the back surface of the silicon cell main body 110 and the second transparent conductive oxide layer 130, and the second electrode 150 extends through the insulating passivation layer 160 and is electrically connected to the second transparent conductive oxide layer 130. Through the configuration of the insulating passivation layer 160, not only the cell has a good passivation effect, but also the second electrode 150 is electrically connected to the second transparent conductive oxide layer 130 and the end of the second electrode 150 is exposed from the insulating passivation layer 160, which does not affect the current collection.

Optionally, the silicon cell main body 110 includes a silicon wafer; a first intrinsic amorphous silicon layer and a first doped amorphous silicon layer located on the front surface of the silicon wafer; and a second intrinsic amorphous silicon layer and a second doped amorphous silicon layer located on the back surface of the silicon wafer. At the edge of the second doped amorphous silicon layer, the second transparent conductive oxide layer 130 is spaced apart from the first transparent conductive oxide layer 120, so as to avoid electrical conduction between the first transparent conductive oxide layer 120 and the second transparent conductive oxide layer 130. Meanwhile, the insulating passivation layer 160 covers the edge of the second doped amorphous silicon layer and the second transparent conductive oxide layer 130, and the second electrode 150 extends through the insulating passivation layer 160 and is electrically connected to the second transparent conductive oxide layer 130.

Continuing to refer to FIG. 3, a height D1 of the second electrode 150 is 12 µm to 15 µm, and a thickness D2 of the insulating passivation layer 160 is 70 nm to 90 nm. Compared with the height of the second electrode, the thickness of the insulating passivation layer 160 is very thin and will not to affect the current collection of the cell. As an example, the height D1 of the second electrode 150 is 12 µm, 12.5 µm, 13 µm, 13.5 µm, 14 µm, 14.5 µm or 15 µm; and the thickness D2 of the insulating passivation layer 160 is 70 nm, 75 nm, 80 nm, 85 nm or 90 nm. Optionally, a width D3 of the second electrode 150 is 50 µm to 60 µm to facilitate the current conduction.

FIG. 5 is a schematic view of a layer structure of the solar cell provided in the embodiment of the present application. Referring to FIG. 5, the solar cell includes a silicon cell main body 110; a first transparent conductive oxide layer 120 and a first electrode 140 located on the front surface of the silicon cell main body 110; and an insulating passivation layer 160, a second transparent conductive oxide layer 130 and a second electrode 150 located on the back surface of the silicon cell main body 110. The insulating passivation layer 160 covers the back surface of the silicon cell main body 110, and the second transparent conductive oxide layer 130 covers the insulating passivation layer 160 and is spaced apart from the first transparent conductive oxide layer 120. Through the configuration of the insulating passivation layer 160, not only the cell has a good passivation effect, but also the setting of the second transparent conductive oxide layer 130 and the second electrode 150 is not affected, so that the current collection effect is good.

Optionally, the silicon cell main body 110 includes a silicon wafer; a first intrinsic amorphous silicon layer and a first doped amorphous silicon layer located on the front surface of the silicon wafer; and a second intrinsic amorphous silicon layer and a second doped amorphous silicon layer located on the back surface of the silicon wafer. The insulating passivation layer 160 covers the second doped amorphous silicon layer. The second transparent conductive oxide layer 130 covers the insulating passivation layer 160 and is spaced apart from the first transparent conductive oxide layer 120.

Continuing to refer to FIG. 3 and FIG. 4, in one embodiment, the silicon wafer can be an N-type silicon wafer, the first doped amorphous silicon layer is an N-type doped amorphous silicon layer, the second doped amorphous silicon layer is a P-type doped amorphous silicon layer, and the insulating passivation layer 160 covers the edge of the P-type doped amorphous silicon layer. In another embodiment, the silicon wafer can be a P-type silicon wafer, the first doped amorphous silicon layer is a P-type doped amorphous silicon layer, the second doped amorphous silicon layer is an N-type doped amorphous silicon layer, and the insulating passivation layer 160 covers the edge of the N-type doped amorphous silicon layer.

Continuing to refer to FIG. 3 and FIG. 4, in the present application, a material of the insulating passivation layer 160 is one selected from $Si_3N_4$, $MgF_2$, and $SiO_x$. The layer structure can play a good insulating passivation effect to improve the efficiency of the cell. For example, the insulating passivation layer 160 is a $Si_3N_4$ layer, or the insulating passivation layer 160 is a $MgF_2$ layer, or the insulating passivation layer 160 is a $SiO_x$ layer.

Optionally, the insulating passivation layer 160 is a $Si_3N_4$ layer, and a refractive index of the $Si_3N_4$ layer is 2.05 to 2.20. As such, the passivation effect is good, and the performance of the cell is further improved. As an example, the refractive index of the $Si_3N_4$ layer is 2.05, 2.10, 2.15, or 2.20.

Continuing to refer to FIG. 3 and FIG. 4, during deposition, the first transparent conductive oxide layer 120 will be deposited on the edge of the silicon cell main body 110. In the present application, the insulating passivation layer 160 covers the first transparent conductive oxide layer 120 on the side surface of the silicon cell main body 110. The insulating passivation layer 160 can cover a part of the first transparent conductive oxide layer 120. The insulating passivation layer 130 can also cover the second transparent conductive oxide layer 130 and the second doped amorphous silicon layer not covered with the second transparent conductive oxide layer 130. As such, the coverage can be relatively completed, which further prevents sodium ions or water vapor invasion into the cell.

In the present application, the first transparent conductive oxide layer 120 and the second transparent conductive oxide layer 130 can be a transparent conductive ITO film or a transparent conductive IWO film.

Following the description of the structure of the solar cell, the method for preparing the solar cell is described below. The method includes the following steps: forming a first transparent conductive oxide layer and a first electrode on the front surface of the silicon cell main body; forming a second transparent conductive oxide layer and a second electrode 150 on the back surface of the silicon cell main body; and forming an insulating passivation layer on an edge of the back surface of the silicon cell main body. The first transparent conductive oxide layer and the second transparent conductive oxide layer are spaced apart from each other. The preparation method can allow the edge of the back surface of the silicon cell main body to be not covered with the second transparent conductive oxide layer, and allow the insulating passivation layer to cover the edge of the back surface of the silicon cell main body, so that the passivation effect of the cell is high.

FIG. 5 is a flowchart of a process for preparing a solar cell provided in an embodiment of the present application. Referring to FIG. 3 and FIG. 5, the preparation method includes the following steps.

S110, a silicon cell main body 110 is prepared.

S111, a first intrinsic amorphous silicon layer is deposited on a front surface of the silicon wafer. Optionally, a thickness of the first intrinsic amorphous silicon layer is 4 nm to 10 nm.

S112, a second intrinsic amorphous silicon layer is deposited on a back surface of the silicon wafer. Optionally, a thickness of the second intrinsic amorphous silicon layer is 6 nm to 12 nm.

S113, a first doped amorphous silicon layer is deposited on the first intrinsic amorphous silicon layer. In one embodiment, the first doped amorphous silicon layer is an N-type doped amorphous silicon layer, i.e., a phosphorus doped amorphous silicon layer. Optionally, a thickness of the N-type doped amorphous silicon layer is 4 nm to 10 nm.

In another embodiment, the first doped amorphous silicon layer is a P-type doped amorphous silicon layer, i.e., a boron doped amorphous silicon layer. Optionally, a thickness of the P-type doped amorphous silicon layer is 6 nm to 12 nm.

S114, a second doped amorphous silicon layer is deposited on the second intrinsic amorphous silicon layer. In one embodiment, the first doped amorphous silicon layer is an N-type doped amorphous silicon layer, and the corresponding second doped amorphous silicon layer is a P-type doped amorphous silicon layer. In another embodiment, the first doped amorphous silicon layer is a P-type doped amorphous silicon layer, and the corresponding second doped amorphous silicon layer is an N-type doped amorphous silicon layer.

S120, a first transparent conductive oxide layer 120 is deposited on the first doped amorphous silicon layer. Optionally, the first transparent conductive oxide layer 120 with a thickness of 90 nm to 130 nm is deposited on the first doped amorphous silicon layer by sputtering.

For example, the deposition is performed by using an ITO target material as a deposition target, under the condition of a power of 10 Kw to 15 Kw, and introducing Ar gas with a flow rate of 1300 sccm to 1500 sccm and $O_2$ gas with a flow rate of 30 slm to 40 slm, obtaining the first transparent conductive oxide layer 120 with a thickness of 90 nm to 130 nm.

Optionally, the refractive index of the first transparent conductive oxide layer 120 is 1.7 to 2.1. In another embodiment, the first transparent conductive oxide layer 120 can be an IWO film, and an IWO target material is used as the deposition target.

S130, a mask plate is disposed on the edge of the second doped amorphous silicon layer, and a second transparent conductive oxide layer 130 is deposited on the second doped amorphous silicon layer. Optionally, the second transparent conductive oxide layer 130 with a thickness of 90 nm to 130 nm is deposited on the second doped amorphous silicon layer by sputtering.

For example, the deposition is performed by using an ITO target material as a deposition target, under the condition of a power of 10 Kw to 15 Kw, and introducing Ar gas with a flow rate of 1100 sccm to 1300 sccm and $O_2$ gas with a flow rate of 30 slm to 40 slm, obtaining the second doped amorphous silicon layer 130 with the thickness of 90 nm to 130 nm.

Optionally, a refractive index of the second transparent conductive oxide layer 130 is 1.7 to 2.1. In another embodiment, the second transparent conductive oxide layer 130 can be an IWO film, and an IWO target material is used as the deposition target.

S140, a first electrode 140 is formed on the first transparent conductive oxide layer 120, and a second electrode 150 is formed on the second transparent conductive oxide layer 130. Optionally, a silver paste is printed on the first transparent conductive oxide layer 120, and then dried and cured to form the first electrode 140 with a height of 12 μm to 15 μm and a width of 50 μm to 60 μm. A silver paste is printed on the second transparent conductive oxide layer 130, and then dried and cured to form the second electrode 150 with a height of 12 μm to 15 μm and a width of 50 μm to 60 μm.

Optionally, the first electrode 140 and the second electrode 150 can be cured simultaneously or separately. Taking curing simultaneously as an example, the method for preparing the first electrode 140 and the second electrode 150 includes: printing a fine grid line on the first transparent conductive oxide layer 120 and baking at 150° C. to 170° C. for 2 min to 4 min, continuing to print a main grid line and baking at 150° C. to 170° C. for 2 min to 4 min; and then flipping over, printing a fine grid line on the second transparent conductive oxide layer 130 and baking at 150° C. to 170° C. for 2 min to 4 min, continuing to print a main grid line and baking at 150° C. to 170° C. for 2 min to 4 min; and then curing at 190° C. to 210° C. for 15 min to 25 min to form the first electrode 140 and the second electrode 150.

S150, the mask plate is removed and an insulating passivation layer 160 is deposited on the second transparent conductive oxide layer 130. The second electrode 150 extends through the insulating passivation layer 160 and is electrically connected to the second transparent conductive oxide layer 130.

Optionally, a thickness of the insulating passivation layer 160 is 70 nm to 90 nm, which has a large difference from the micron level height of the second electrode 150. Therefore, the disposition of the insulating passivation layer 160 can not only make the cell to have a good passivation effect, but also does not affect the welding strength between the second electrode 150 and a welding strip, thereby not affecting the electric conductivity between the second electrode 150 and the welding strip and not affecting the current collection.

In one embodiment, the insulating passivation layer 160 is $Si_3N_4$, and a method for forming the insulating passivation layer 160 includes: introducing and then depositing $SiH_4$ gas and $NH_3$ gas to form a $Si_3N_4$ layer with a thickness of 70 nm to 90 nm.

Optionally, the $Si_3N_4$ layer with the thickness of 70 nm to 90 nm is formed by introducing the $SiH_4$ gas with a flow rate of 1000 sccm to 2000 sccm and the $NH_3$ gas with a flow rate of 6000 sccm to 8000 sccm under the conditions of a temperature of 240° C. to 260° C., a power of 10 Kw to 20 Kw, and a vacuum degree of 1500 mtorr to 2000 mtorr.

For example, a deposition device is plate-type PECVD or tube-type PECVD devices. The deposition process includes: loading the silicon wafer on which the first electrode 140 and the second electrode 150 are formed into a preheating chamber for preheating, then deposition in a process chamber, processing in a vent chamber, and then discharging. Optionally, the silicon wafer is loaded onto a CVD carrier plate. The carrier plate and the silicon wafer are preheated to 250° C. in a preheating chamber of 250° C. to 300° C., during which the preheating chamber is evacuated to a vacuum degree of 2000 mtorr. Then, the deposition is performed in the process chamber by introducing $SiH_4$ gas with a flow rate of 1200 sccm and $NH_3$ gas with a flow rate of 7000 sccm under the conditions of a temperature of 250° C., a vacuum degree of 1700 mtorr and a power of 14 Kw and exciting plasma by using microwave with a power of 2.45 GHz. After the completion of the deposition, the carrier plate and the silicon wafer are processed in the vent chamber and then discharged to obtain a $Si_3N_4$ layer with a thickness of 80 nm and a refractive index of 2.10.

In another embodiment, the insulating passivation layer 160 is $MgF_2$, and a method for forming the insulating passivation layer 160 includes: sputtering deposition of a $MgF_2$ layer with a thickness of 70 nm to 90 nm by means of magnetron sputtering. Optionally, the $MgF_2$ layer with the thickness of 70 nm to 90 nm is formed by introducing Ar gas with a flow rate of 1000 sccm to 8000 sccm under the condition of a power of 10 Kw to 15 Kw and using $MgF_2$ as the target material.

In yet another embodiment, the insulating passivation layer 160 is $SiO_x$, and a method for forming the insulating passivation layer 160 includes: introducing $SiH_4$ gas and $N_2O$ gas and then co-depositing to form a $SiO_x$ layer with a thickness of 70 nm to 90 nm. Optionally, the $SiO_x$ layer with the thickness of 70 nm to 90 nm is formed by introducing $SiH_4$ gas with a flow rate of 1000 sccm to 2000 sccm and $N_2O$ gas with a flow rate of 6000 sccm to 8000 sccm under the conditions of a temperature of 240° C. to 260° C., a power of 10 Kw to 20 Kw, and a vacuum degree of 1500 mtorr to 2000 mtorr.

It should be noted that the aforementioned steps S110 to S150 are not limited to being performed in the above order. For example, the first intrinsic amorphous silicon layer and the second intrinsic amorphous silicon layer can be formed simultaneously, and then the first doped amorphous silicon layer and the second doped amorphous silicon layer are formed. Alternatively, the first intrinsic amorphous silicon layer and the first doped amorphous silicon layer can be first formed, and then the second intrinsic amorphous silicon layer and the second doped amorphous silicon layer are formed. Alternatively, the first transparent conductive oxide layer 120 and the first electrode 140 can be first formed, and then the second transparent conductive oxide layer 130 and the second electrode 150 are formed. The present application does not limit the preparation order of the layer structure.

FIG. 6 is a flow chart of a preparation process of a solar cell provided in an embodiment of the present application. Referring to FIG. 4 and FIG. 6, the preparation method includes the following steps:

S210, preparing a silicon cell main body 110;

S220, depositing a first transparent conductive oxide layer 120 on a first doped amorphous silicon layer;

S230, depositing an insulating passivation layer 160 on a second doped amorphous silicon layer, optionally, wherein the insulating passivation layer 160 wraps around the side surface of the silicon cell main body 110 to cover the first transparent conductive oxide layer 120 on the side surface of the silicon cell main body 110;

S240, depositing a second transparent conductive oxide layer 130 on the insulating passivation layer 160, wherein the first transparent conductive oxide layer 120 is spaced apart from the second transparent conductive oxide layer 130; and S250, forming a first electrode 140 on the first transparent conductive oxide layer 120, and forming a second electrode 150 on the second transparent conductive oxide layer 130.

In this embodiment, the methods of forming the silicon cell main body 110, the first transparent conductive oxide layer 120, the insulating passivation layer 160, the second transparent conductive oxide layer 130, the first electrode 140 and the second electrode 150 are consistent with the above methods and will not be repeated herein.

It should be noted that the aforementioned steps S210 to S250 are not limited to being performed in the above order. For example, the first intrinsic amorphous silicon layer and the second intrinsic amorphous silicon layer can be formed simultaneously, and then the first doped amorphous silicon layer and the second doped amorphous silicon layer are formed. Alternatively, the first intrinsic amorphous silicon layer and the first doped amorphous silicon layer can be first formed, and then the second intrinsic amorphous silicon layer and the second doped amorphous silicon layer are formed. Alternatively, the first transparent conductive oxide layer 120 and the first electrode 140 can be first formed, and then the second transparent conductive oxide layer 130 and the second electrode 150 are formed. The present application does not limit the preparation order of the layer structure.

The technical solutions in embodiments of the present application will be described clearly and completely below in order to make the objectives, technical solutions, and advantages of the embodiments of the present application clearer. If specific conditions are not indicated in the examples, the processes are carried out in accordance with the conventional conditions or the conditions recommended by the manufacturer. The reagents or instruments for which no manufacturers are noted are all common products that can be purchased from the market.

Example 1

A method for preparing a solar cell provided in the example included the following steps.

(1) An N-type silicon wafer with a thickness of 20 μm and a side length of 166.1 mm was double-side textured to obtain a pyramidal textured surface with a height of 3 μm.

(2) The N-type silicon wafer was placed in a IINP device, to form a first intrinsic amorphous silicon layer with a thickness of 5 nm on the front surface of the N-type silicon wafer and form a second intrinsic amorphous silicon layer with a thickness of 10 nm on the back surface of the N-type silicon wafer.

(3) Next, an N-type doped amorphous silicon layer with a thickness of 5 nm was formed on the first intrinsic amorphous silicon layer.

(4) Next, a P-type doped amorphous silicon layer with a thickness of 10 nm was formed on the second intrinsic amorphous silicon layer.

(5) Deposition was performed by using an ITO target material as a deposition target, under the condition of a power of 13.3 Kw, and introducing Ar gas with a flow rate of 1400 sccm and $O_2$ gas with a flow rate of 34 slm, obtaining a first transparent conductive oxide layer 120 with a thickness of 80 nm.

(6) A mask plate was disposed on the edge of the P-type doped amorphous silicon layer. Deposition was performed by using an ITO target material as a deposition target, under the condition of a power of 13.5 Kw, and introducing Ar gas with a flow rate of 1200 sccm and $O_2$ gas with a flow rate of 34 slm, obtaining a second transparent conductive oxide layer 130 with a thickness of 80 nm.

(7) A fine grid silver paste was printed on the first transparent conductive oxide layer 120 and baked at 160° C. for 3 min, and then a main grid silver paste was printed and baked at 160° C. for 3 min. Next, the silicon wafer was flipped over. A fine grid silver paste was printed on the second transparent conductive oxide layer 130 and baked at 160° C. for 3 min, and then a main grid silver paste was printed and baked at 160° C. for 3 min, followed by curing at 200° C. for 20 min to form a first electrode 140 and a second electrode 150 containing the fine grid with a height of 14 μm and a width of 55 μm.

(8) The silicon wafer was loaded onto a CVD carrier plate. The carrier plate and the silicon wafer were preheated to 250° C. in a preheating chamber of 250° C. to 300° C., during which the preheating chamber was evacuated to a vacuum degree of 2000 mtorr. Then, the deposition was performed in a process chamber by introducing $SiH_4$ gas with a flow rate of 1200 sccm and $NH_3$ gas with a flow rate of 7000 sccm under the conditions of a temperature of 250° C., a vacuum degree of 1700 mtorr and a power of 14 Kw and exciting plasma by using microwave with a power of 2.45 GHz. After the completion of the deposition, the carrier plate and the silicon wafer were processed in a vent chamber and then discharged to obtain a $Si_3N_4$ layer with a thickness of 80 nm.

(9) Light was injected into the solar cell and then tested for sorting.

Example 2

The preparation method in Example 2 was basically the same as that in Example 1, except that step (6) to step (8) of Example 2 were respectively as follows.

(6) The silicon wafer was loaded onto a CVD carrier plate. The carrier plate and the silicon wafer were preheated to 250° C. in a preheating chamber of 250° C. to 300° C., during which the preheating chamber was evacuated to a vacuum degree of 2000 mtorr. Then, the deposition was performed in a process chamber by introducing $SiH_4$ gas with a flow rate of 1200 sccm and $NH_3$ gas with a flow rate of 7000 sccm under the conditions of a temperature of 250° C., a vacuum degree of 1700 mtorr and a power of 14 Kw and exciting plasma by using microwave with a power of 2.45 GHz. After the completion of the deposition, the carrier plate and the silicon wafer were processed in a vent chamber and then discharged to obtain a $Si_3N_4$ layer with a thickness of 80 nm.

(7) The $Si_3N_4$ layer was subjected to deposition by using an ITO target material as a deposition target, under the condition of a power of 13.5 Kw, and introducing Ar gas with a flow rate of 1200 sccm and $O_2$ gas with a flow rate of 34 slm, obtaining a second transparent conductive oxide layer 130 with a thickness of 80 nm.

(8) A fine grid silver paste was printed on the first transparent conductive oxide layer 120 and baked at 160° C. for 3 min, and then a main grid silver paste was printed and baked at 160° C. for 3 min. Next, the silicon wafer was flipped over. A fine grid silver paste was printed on the second transparent conductive oxide layer 130 and baked at 160° C. for 3 min, and then a main grid silver paste was printed and baked at 160° C. for 3 min, followed by curing at 200° C. for 20 min to form a first electrode 140 and a second electrode 150 containing the fine grid with a height of 14 μm and a width of 55 μm.

Example 3

The preparation method in Example 3 was basically the same as that in Example 1, except that in step (8) of Example 3, the deposition was performed by using $MgF_2$ as the target material, and introducing Ar gas with a flow rate of 6000 sccm under the condition of a power of 12 Kw, thereby obtaining a $MgF_2$ layer with a thickness of 80 nm.

Example 4

The preparation method in Example 4 was basically the same as that in Example 1, except that in step (8) of Example 4, the deposition was performed by introducing $SiH_4$ gas with a flow rate of 1500 sccm and $N_2O$ gas with a flow rate of 7000 sccm under the conditions of a temperature of 250° C., a power of 16 Kw and a vacuum degree of 1600 mtorr, thereby obtaining a $SiO_x$ layer with a thickness of 80 nm.

Comparative Example 1

The preparation method in Comparative Example 1 was basically the same as that in Example 1, except that step (8) was not performed in Comparative Example 1.

Experimental Example 1

The performances of the solar cells obtained in Examples 1 to 4 and Comparative Example 1 were respectively tested and shown in Table 1. The electrical performance parameters of the solar cells such as conversion efficiency Eta, open circuit voltage Uoc, short circuit current Isc, fill factor FF, series resistance Rs, shunt resistance Rsh, reverse current IRev2, etc., were tested by using the halm online I-V test system under the conditions of 25° C., AM 1.5 and 1 standard sun.

TABLE 1

| | | | | | | | | |
|---|---|---|---|---|---|---|---|---|
| Performances of solar cells | | | | | | | | |
| | Quantity | Eta (%) | Uoc (mV) | Isc (mA) | FF (%) | Rs (Ω) | Rsh (mΩ) | IRev2 (A) |
| Example 1 | 482 | 24.20 | 0.7440 | 10.574 | 84.42 | 0.0017 | 2087 | 0.0032 |
| Example 2 | 497 | 24.18 | 0.7440 | 10.578 | 84.32 | 0.0018 | 2298 | 0.0030 |
| Example 3 | 495 | 24.18 | 0.7436 | 10.576 | 84.40 | 0.0017 | 2094 | 0.0041 |
| Example 4 | 480 | 24.17 | 0.7435 | 10.570 | 84.43 | 0.0017 | 1985 | 0.0047 |
| Comparative Example 1 | 499 | 24.16 | 0.7430 | 10.575 | 84.41 | 0.0017 | 2134 | 0.0050 |

As can be seen from Table 1, compared with Comparative Example 1, the solar cells of the present application provided in Examples 1 to 4 exhibited improved conversion efficiency and open circuit voltage, significantly decreased reverse current, showing better performance of cell.

Compared with Examples 3 and 4, the solar cell provided in Example 1 exhibited better performance, indicating that selecting silicon nitride as the material of the insulating passivation layer can further improve the performance of cell.

Compared with Example 2, the solar cell provided in Example 1 exhibited better performance, indicating that compared with plating a silicon nitride passivation layer between the front and back TCO films, forming the insulating passivation layer after the second electrode is prepared can further improve the performance of cell.

Experimental Example 2

The solar cells obtained in Examples 1 to 4 and Comparative Example 1 were respectively used to prepare photovoltaic modules, and a DH1000 test under conditions of a temperature of 85° C., a humidity of 85% and a duration time of 1000 hours was performed. The results are shown in Table 2.

TABLE 2

| | | | |
|---|---|---|---|
| DH1000 test results of solar cells | | | |
| | DH1000 power attenuation | Standard | Determination |
| Example 1 | 2.44% | <5% | Qualified |
| Example 2 | 2.42% | <5% | Qualified |
| Example 3 | 2.82% | <5% | Qualified |
| Example 4 | 2.95% | <5% | Qualified |
| Comparative Example 1 | 3.25% | <5% | Qualified |

It can be seen from Table 2 that the DH1000 test results provided by the examples and comparative example of the present application are all qualified. Further, the DH1000 power attenuation rates of the solar cells provided in the examples of the present application are lower.

The embodiments described above are a part of rather than all of the embodiments of the present application. The detailed description of the embodiments of the present application is not intended to limit the protection scope of the present application, but merely indicates selected embodiments of the present application. Based on the embodiments in the present application, all other embodiments obtained by ordinary technicians in the art without creative work are within the scope of protection of the present application.

What is claimed is:

1. A solar cell, comprising a silicon cell main body, a first transparent conductive oxide layer, a second transparent conductive oxide layer, an insulating passivation layer, a first electrode and a second electrode;

wherein the first transparent conductive oxide layer and the first electrode are located on a front surface of the silicon cell main body;

the second transparent conductive oxide layer and the second electrode are located on a back surface of the silicon cell main body;

the insulating passivation layer covers an edge of the back surface of the silicon cell main body;

wherein the insulating passivation layer covers the back surface of the silicon cell main body, and the second transparent conductive oxide layer covers the insulating passivation layer; and at the edge of the back surface of the silicon cell main body, the second transparent conductive oxide layer and the first transparent conductive oxide layer are spaced apart from each other by the insulating passivation layer.

2. The solar cell according to claim 1, wherein a height of the second electrode is 12 μm to 15 μm.

3. The solar cell according to claim 1, wherein a thickness of the insulating passivation layer is 70 nm to 90 nm.

4. The solar cell according to claim 1, wherein the insulating passivation layer is one selected from $Si_3N_4$, $MgF_2$, and $SiO_x$.

5. The solar cell according to claim 4, wherein the insulating passivation layer is a $Si_3N_4$ layer, and a refractive index of the $Si_3N_4$ layer is 2.05 to 2.20.

6. The solar cell according to claim 1, wherein a width of the second electrode is 50 μm to 60 μm.

7. The solar cell according to claim 1, wherein the silicon cell main body comprises a silicon wafer, a first intrinsic amorphous silicon layer, a first doped amorphous silicon layer, a second intrinsic amorphous silicon layer, and a second doped amorphous silicon layer;

the first intrinsic amorphous silicon layer and the first doped amorphous silicon layer are sequentially disposed on a front surface of the silicon wafer, and the second intrinsic amorphous silicon layer and the second doped amorphous silicon layer are sequentially disposed on a back surface of the silicon wafer; and at an edge of the second doped amorphous silicon layer, the second transparent conductive oxide layer and the first transparent conductive oxide layer are spaced apart from each other, and the insulating passivation layer covers the edge of the second doped amorphous silicon layer.

8. A method for preparing the solar cell according to claim 1, comprising the following steps of:

forming a first transparent conductive oxide layer and a first electrode on a front surface of a silicon cell main body;

forming a second transparent conductive oxide layer and a second electrode on a back surface of the silicon cell main body;

forming an insulating passivation layer on an edge of the back surface of the silicon cell main body, wherein the step of forming the insulating passivation layer is performed after the step of forming the first transparent conductive oxide layer and prior to the step of forming the second transparent conductive oxide layer, wherein the insulating passivation layer covers the back surface of the silicon cell main body, and the second transparent conductive oxide layer covers the insulating passivation layer; and the first transparent conductive oxide layer and the second transparent conductive oxide layer are spaced apart from each other by the insulating passivation layer.

9. The method according to claim 8, wherein the insulating passivation layer is one selected from $Si_3N_4$, $MgF_2$, and $SiO_x$.

10. The method according to claim 9, wherein the insulating passivation layer is $Si_3N_4$, and a method for forming the insulating passivation layer comprises: introducing $SiH_4$ gas and $NH_3$ gas and then co-depositing to form a $Si_3N_4$ layer with a thickness of 70 nm to 90 nm.

11. The method according to claim 9, wherein the insulating passivation layer is $MgF_2$, and a method for forming the insulating passivation layer comprises: sputtering and depositing an $MgF_2$ layer with a thickness of 70 nm to 90 nm by magnetron sputtering.

12. The method according to claim 9, wherein the insulating passivation layer is $SiO_x$, and a method for forming the insulating passivation layer comprises: introducing $SiH_4$ gas and $N_2O$ gas, and then co-depositing to form a $SiO_x$ layer with a thickness of 70 nm to 90 nm.

13. The method according to claim 8, wherein a method for preparing the silicon cell main body comprises:

depositing a first intrinsic amorphous silicon layer and a first doped amorphous silicon layer on a front surface of a silicon wafer; and depositing a second intrinsic amorphous silicon layer and a second doped amorphous silicon layer on a back surface of the silicon wafer.

14. The method according to claim 8, wherein the method comprises the following steps of:

preparing a silicon cell main body, wherein the silicon cell main body comprises a silicon wafer, a first intrinsic amorphous silicon layer and a first doped amorphous silicon layer on a front surface of the silicon wafer, and a second intrinsic amorphous silicon layer and a second doped amorphous silicon layer on a back surface of the silicon wafer;

depositing a first transparent conductive oxide layer on the first doped amorphous silicon layer;

depositing an insulating passivation layer on the second doped amorphous silicon layer;

depositing a second transparent conductive oxide layer on the insulating passivation layer, wherein the first transparent conductive oxide layer is spaced apart from the second transparent conductive oxide layer; and forming a first electrode on the first transparent conductive oxide layer, and forming a second electrode on the second transparent conductive oxide layer.

15. The method according to claim 14, wherein during depositing the insulating passivation layer on the second doped amorphous silicon layer, the insulating passivation layer further wraps around a side surface of the silicon cell main body to cover the first transparent conductive oxide layer on the side surface of the silicon cell main body.

* * * * *